United States Patent [19]

Ahrabi et al.

[11] Patent Number: 5,099,488
[45] Date of Patent: Mar. 24, 1992

[54] RIBBED SUBMOUNTS FOR TWO DIMENSIONAL STACKED LASER ARRAY

[75] Inventors: Mitra Ahrabi, Los Gatos; Gerald S. Browder, San Jose; John G. Endriz, Belmont; Gary L. Harnagel; D. Philip Worland, both of San Jose, all of Calif.

[73] Assignee: Spectra Diode Laboratories, Inc., San Jose, Calif.

[21] Appl. No.: 676,758

[22] Filed: Mar. 27, 1991

[51] Int. Cl.$^5$ .............................................. H01S 3/04
[52] U.S. Cl. ..................................... 372/361; 372/50; 357/76; 357/81; 357/17
[58] Field of Search .................... 372/36, 34, 50, 44; 357/76, 81, 17

[56] References Cited

U.S. PATENT DOCUMENTS

| | | | |
|---|---|---|---|
| 4,315,225 | 2/1982 | Allen, Jr. et al. | 372/36 |
| 4,627,062 | 12/1986 | Bender | 372/36 |
| 4,716,568 | 12/1987 | Scifres et al. | 372/36 |
| 4,719,635 | 1/1988 | Yeh | 372/50 |
| 4,897,764 | 1/1990 | Bruchmann et al. | 361/387 |
| 4,967,299 | 10/1990 | Katoh et al. | 360/121 |
| 5,025,451 | 6/1991 | Jansen et al. | 372/50 |

FOREIGN PATENT DOCUMENTS

| | | | |
|---|---|---|---|
| 0164589 | 12/1981 | Japan | 372/36 |
| 0155790 | 9/1982 | Japan | 372/36 |

Primary Examiner—Georgia Epps
Attorney, Agent, or Firm—Schneck & McHugh

[57] ABSTRACT

A laser array submount structure for assembly into a two-dimensional stacked array with precise separation between laser diodes of adjacent submounts. The submount includes a deformable metal layer, such as a soft solder, on one major surface of a laser array support plate. A spacer element having spaced apart ridges is disposed on the opposite major surface. A laser diode array is mounted on a front edge of the support plate. In a cold bonding step, submounts are pressed together causing ridges to penetrate the deformable metal layer to a specified depth. The displaced metal spreads into channels between the ridges, allowing pressing of multiple laser array submounts into stackes of precise total tolerance.

23 Claims, 5 Drawing Sheets

RIBBED SUBMOUNTS FOR TWO DIMENSIONAL STACKED LASER ARRAY

STATEMENT AS TO RIGHTS TO INVENTIONS MADE UNDER FEDERALLY SPONSORED RESEARCH AND DEVELOPMENT

This invention was made with government support under Contract No. N66001-89-C-6016 awarded by the Department of the Navy. The government has certain rights in the invention.

TECHNICAL FIELD

The present invention relates to two-dimensional stacked diode laser array assemblies, and in particular to structures for the plural discrete laser array submount units that make up such assemblies, as well as to methods of bonding the submount units together to form completed assemblies.

BACKGROUND ART

There exists a number of optical systems that require the high optical power densities which are provided by two-dimensional diode laser arrays. For example, high power densities are needed for the optical pumping of Nd:YAG lasers and the like. One structure that can supply such power is a stacked array assembly, such as those described in U.S. Pat. No. 4,716,568 to Scifres et al. Stacked array assemblies include linear diode laser arrays or "laser bars," typically with aperture lengths near or in excess of 1 cm, individually bonded to submounts. The submounts are in turn stacked one above the other in such a manner that the laser apertures point in a common direction, thereby creating a two-dimensional structure with high power density. Very dense structures are capable of providing pulsed outputs in excess of 3 kw/cm$^2$, while less dense structures are capable of providing continuous outputs in excess of 100 W/cm$^2$ Many of such array assemblies can be butted together in both dimensions to produce very large area outputs.

A key element of the array assemblies is the structure of the submounts on which the laser bars are mounted and which must be bonded together to complete the assembly. The submount must provide adequate thermal conductivity to remove waste heat from the laser bar. It must conduct electricity to the laser bar, as well as provide electrical interconnection between adjacent submount units. The submounts must also have sufficient mechanical integrity and be bonded together in a manner that minimizes the transmission of life-limiting mechanical stress to the laser. For example, in order to minimize stress on the lasers, the submount units in the aforementioned Scifres et al. patent may be a combination of support plates, into which the laser bars are mounted, together with separate spacer plates for providing a gap, where the submount units are stacked together, between the laser bars with their wire bonds and the support plate of the adjacent submount unit. Alternatively, the submount units may be unitary members shaped to provide both support for the laser bars and the necessary gap or spacing between the laser bar and the adjacent submount. The assembly of stacked submount units is held together in the Scifres et al. patent by bolts passing through holes in the submount units.

Another important criterion that should be met in a stacked array assembly is accurate registration of the submount units over long distances. One reason that registration is important is that it is desirable in many optical systems to be able to use prefabricated plastic or glass molded lens arrays in front of the laser array assembly, or even prefabricated fiberoptic waveguide ribbons or bundles butted against the assembly. In these cases, the individual lenslets of the lens arrays or the input apertures of the individual waveguides in the ribbons or bundles must be accurately aligned with the corresponding individual laser light emitters of the two-dimensional laser array assembly in order to properly transfer the output beam to where it is needed or to transform its image into a useful form, whether as a collimated beam or focussed spot. Even in cases where only simple lens systems are used, it is important that the spacing between submounts be precisely controllable, because such spacing affects the overall output beam shape of the array, and also because the uniformity or lack of uniformity of the spacing between laser bars affects the far field pattern of the beam.

In addition to the optical effects from a precise control of registration, there is also an important thermal effect. Because submounts are bonded together so as to be connected to an electrical power source in series, each submount is at a different electrical potential or voltage relative to ground. This means that a heat sink plate or block placed at the back end of the stacked submounts, and to which the submounts are bonded so as to remove heat from the submounts, must be electrically insulating to avoid shorting the submounts. If the back bonding is to be accomplished with high thermal conductance, then metal solders, rather than epoxy or other resins, are preferred. In order to use metal solders for bonding, the insulative heat sink plate or block must be premetalized in a registered pattern to avoid shorting, and the submount positions must register with the premetalized pattern. If such registration could be achieved, the low thermal resistance that would be provided by the better bond would allow the array assembly to be operated at much higher power levels.

However, mechanical tolerances of the support plate thickness, laser bar height and wire bonds make presently available submount structures difficult to align.

Accordingly, it is an object of the invention to provide a submount structure and corresponding bonding technique that enables a two-dimensional stacked diode laser array assembly to be constructed with more precise control over the separation and alignment of the submount structures that make up the assembly.

SUMMARY OF THE INVENTION

The above object has been met with a submount structure in which a deformable metal layer, such as a soft solder, is disposed on one major surface of a laser array support plate and spacing element having plural spaced apart hard projections protruding outwardly from the opposite major surface of the support plate. A linear laser diode array is mounted at the front edge of one major surface of the support plate. The corresponding method of assembling these submount structures includes a cold bonding step in which the submounts are pressed together. The projections, which may be ridges, penetrate the deformable metal layer of an adjacent submount, allowing the submounts to be pressed to a precise specified separation. The projections also define nonprojecting surface regions, such as channels, therebetween which allow the deformable metal displaced by the projections to be squeezed out and at least partially fill those surface regions.

BEST MODE FOR CARRYING OUT THE INVENTION

Figure 1:
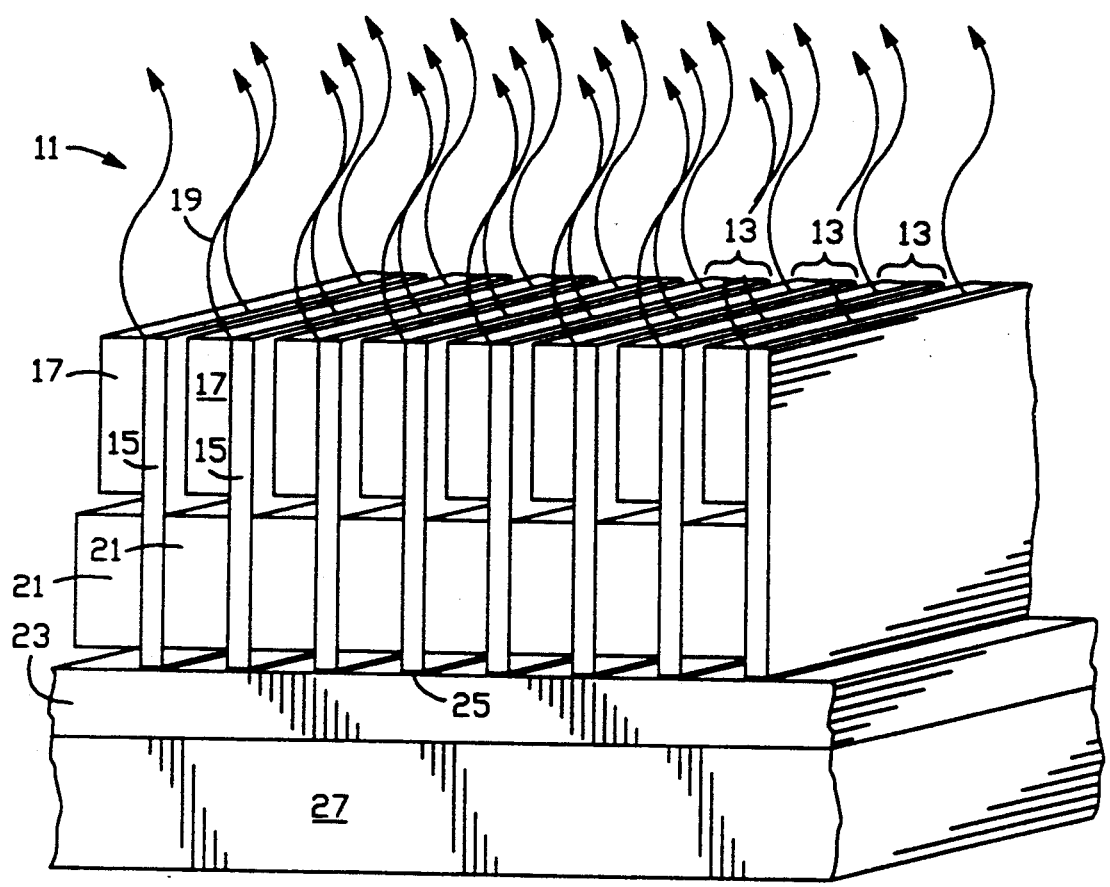
FIG. 1 is a perspective view of a two-dimensional laser diode array assembly made up of plural stacked laser array submounts of the present invention.

With reference to FIG. 1, a two-dimensional semiconductor diode laser array assembly 11 of the present invention is made up of a plurality of linear diode laser array submount structures 13 of the present invention that are stacked one on top of another and bonded together in a manner that provides electrical connection between the submounts 13 to their constituent laser arrays 17. Each of the submounts 13 includes a support plate 15 on which a linear monolithic semiconductor diode laser array or "laser bar" 17 is mounted. Each laser bar 17 emits laser light 19 from a line of plural emission sources, which when combined with the light from other laser bars 17 in the assembly 11 forms a two-dimensional array of emitted laser light 19. Preferably, the sources are phase-locked for coherent laser light output 19, but this is not essential to the assembly's operation. Each submount 13 also includes spacer elements 21 for providing the necessary physical standoff or spacing between a laser bar 17 of one submount and the support plate 15 of an adjacent submount.

Support plates 15 are thermally conductive to remove excess heat from the laser bars 17, and may be composed of ceramics, such as BeO, or metal, such as a Cu-W alloy. An electrically insulative, but thermally conductive back plate 23 is butted against the rear edges of the support plates 15. The back plate 23 is typically made of a heat conducting ceramic material, such as BeO, Si, TCBN, diamond, $Al_2O_3$ or SiC. For good thermal transfer, the support plates 15 are bonded to the back plate 23 by means of a preregistered pattern of metal solder or braze material 25 on the back plate 23. A metal heat sink plate 27 or liquid cooler may be provided behind back plate 23 to dissipate the heat removal from the laser bars 17.

Figure 2:
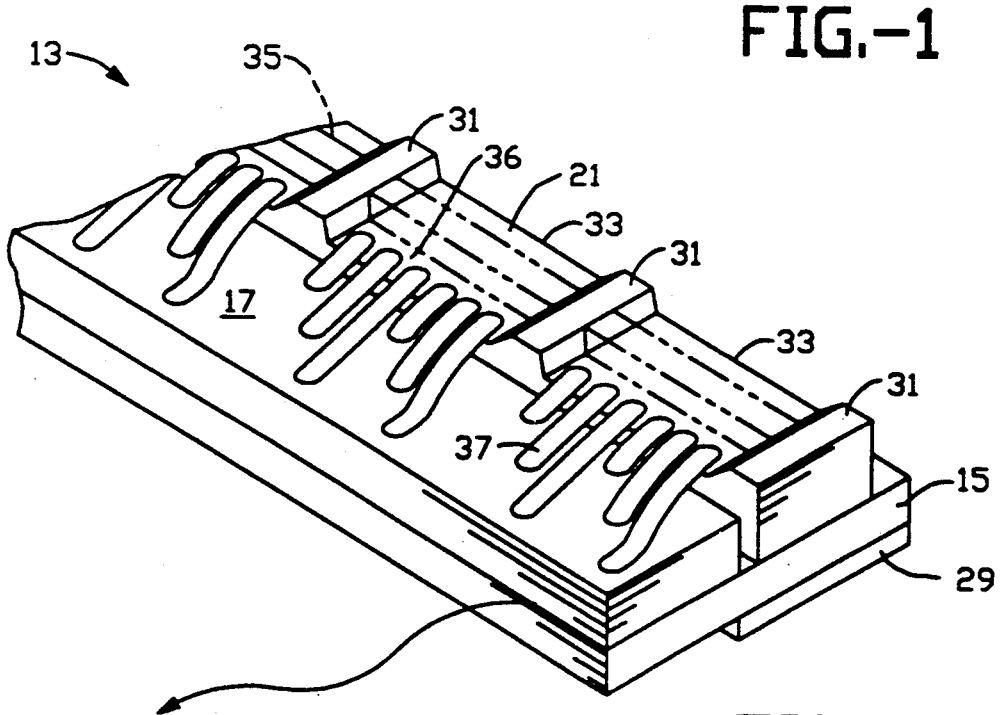
FIG. 2 is a perspective view of a laser array submount structure for use forming the two-dimensional laser array assembly of FIG. 1.

With reference to FIG. 2, an important feature of the invention is the structure of each submount 13. In particular, each submount 13 is provided not only with a laser bar 17 and spacer 21 on a support plate 15, but also with a layer 29 of deformable metal material on the side of the support plate 15 opposite from spacer 21, and with the spacer 21 having a nonplanar surface profile forming a set of hard projections, such as spaced apart ribs or ridges 31, protruding outward from the spacer 21 and intended to penetrate into the deformable metal layer of an adjacent submount and thereby bind the submounts firmly together. It is the presence of these two features which principally allows the submounts to be bonded together with precise separation in order to achieve accurate registration of the laser bars 17 with prefabricated optics.

The deformable metal layer 29 is typically a soft solder that flows or spreads somewhat when pressed without heating. For example, a soft solder could consist of elemental indium, tin, bismuth, thallium, cadmium or lead. An indium solder is preferred. Alternatively, the soft solder could be an alloy of two or more of the elements gallium, indium, tin, bismuth, thallium, cadmium, lead, zinc and antimony. Such solders should have a melting temperature of at least 100° C. to avoid their becoming too soft or even liquefy at the operating temperature of the laser array assembly. However, solders which melt at temperatures above about 400° C. tend to be too hard at room temperature (20° C.) to deform and spread when pressed. Some nonsolder metals with higher melting points that are highly ductile or malleable, such as gold, could be used.

The ridges 31 on the spacer 21 protrude from the exposed surface of spacer 21 in a direction perpendicular to the major surface of the support plate 15. The ridges 31 should be hard enough not to substantially deform under pressure so as to be able to penetrate the solder layer 29 of an adjacent submount when the two submounts are pressed together. The ridges 31 are spaced apart so as to define channels 33 therebetween. The channels 33 are deep enough, i.e. the ridges protrude far enough, to accommodate the diameter of wire leads 37 in the channels 33. The spacer channel surfaces 33 preferably lie in a plane above the top of the laser bar 17 and the ridges extend above the cumulative height of the laser bar 17 together with wire leads 37. This produces enough space to accommodate wire bonding with a gap between the leads 37 on the laser bar 17 and the bottom of the support plate 15 of the adjacent submount 13 above it.

The ridges 31 in FIG. 2 are shown to be parallel to one another and oriented in a longitudinal (front-to-back) direction perpendicular to the laser bar's front emitting facet 18. This orientation is basically arbitrary, except that it must permit wire bonding to the channel surfaces 33 without the wire leads 37 having to pass over any ridges 31. Other orientations could be used provided this one wire bonding condition is met. For example, ridges 35 could be oriented in a lateral direction parallel to the laser bar's emitting facet 18, as shown in phantom, provided the first ridge is spaced back from the front of the spacer 21 to provide a channel portion 36 at the front edge to accommodate the wire leads 37. The ridges 33 or 35 need not be parallel and could cross one another in a waffle or honeycomb pattern with openings between the ridges to receive, such as when both longitudinal and lateral ridges 31 and 35 are present. An array of spaced apart projections in the form of mesas, buttes or spikes could also be used. The number and spacing of the ridges in not especially critical, except that there should be enough ridges present to give a good bond by penetration into the solder layer 29 of an adjacent submount, and there should not be so many nor should they be so closely spaced as to obstruct the placement of wire bonds or to leave too little room for the solder to spread into the channels. A typical number is 5–20 longitudinally oriented ridges 31 at 0.5 to 2 mm spacing. 5 to 10 laterally oriented ridges 35 at similar spacing could also be provided.

Figure 3:
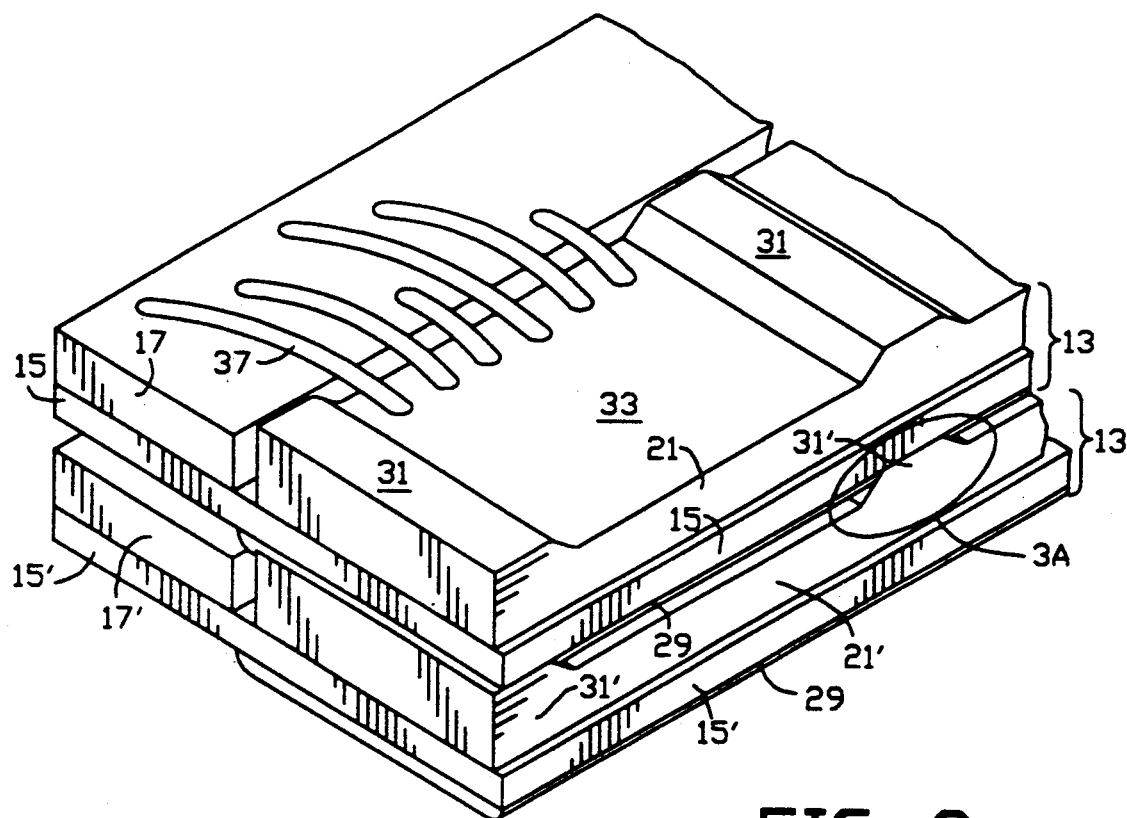
FIG. 3 is a perspective view of a pair of submounts of FIG. 2 bonded together.
Figure 3A:
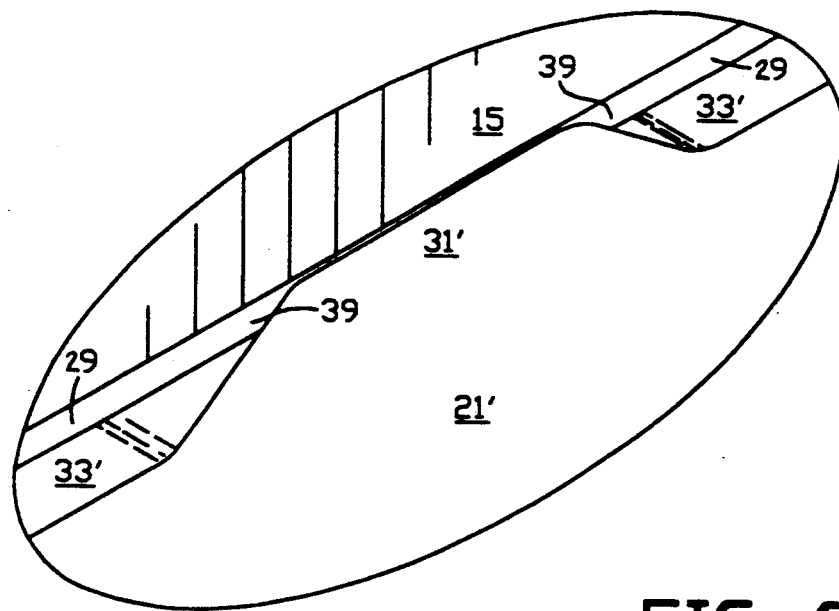
FIG. 3A is an enlarged perspective view of the circled area 3A in FIG. 3, illustrating the cold flow under pressure of the deformable metal bonding layer of the submount structure of the present invention.
Figure 4:
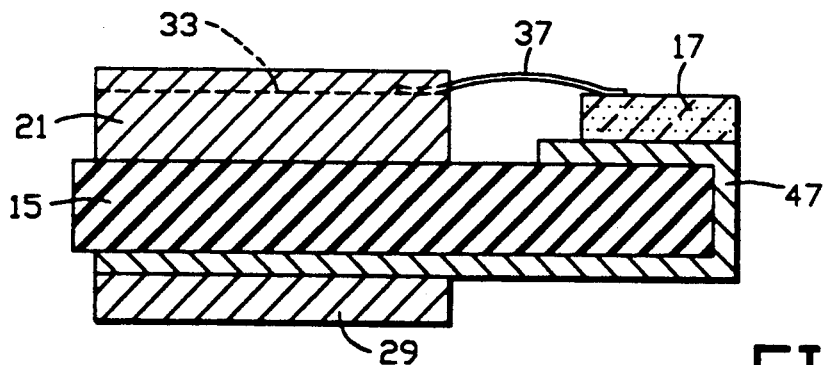
FIGS. 4–11 are side sectional views taken along the line A—A in FIG. 2 of various alternative submount structures and materials suitable for use in the present invention.
Figure 5:
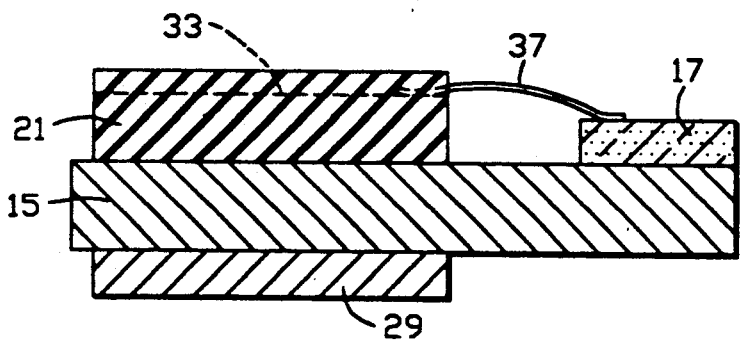
Figure 6:
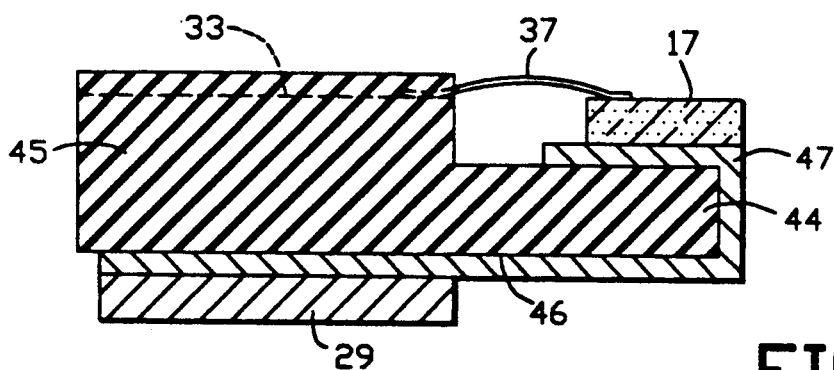
Figure 7:
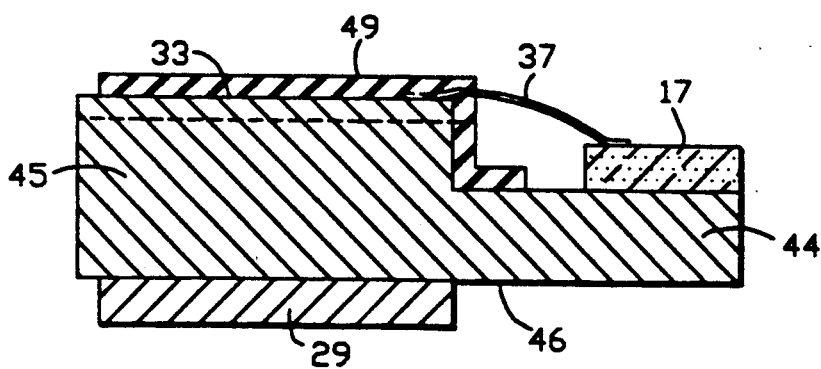
Figure 8:
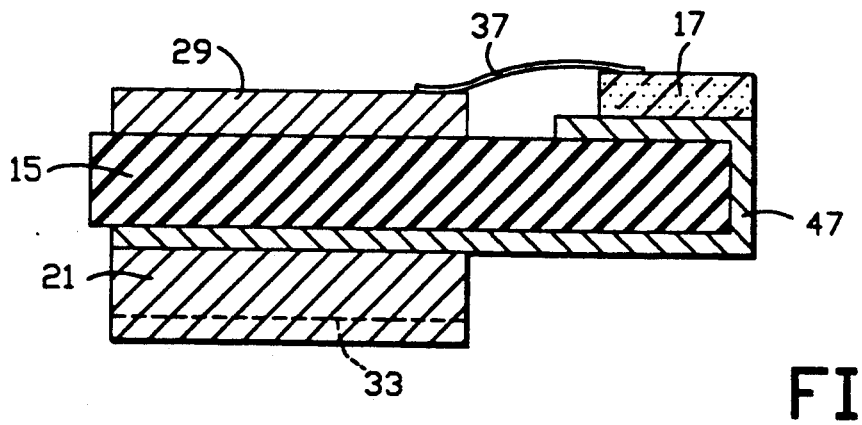
Figure 9:
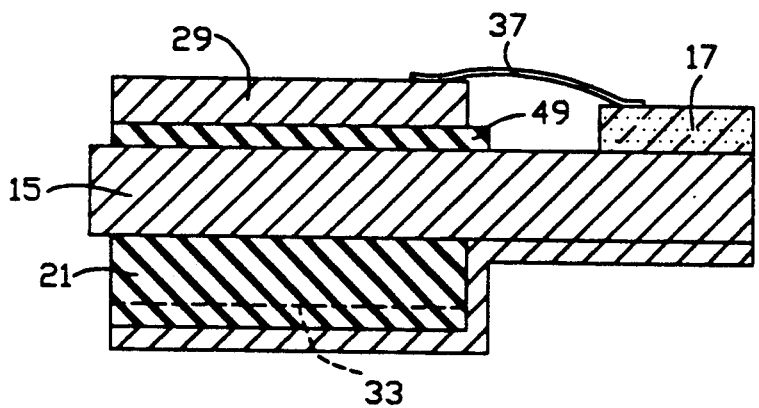
Figure 10:
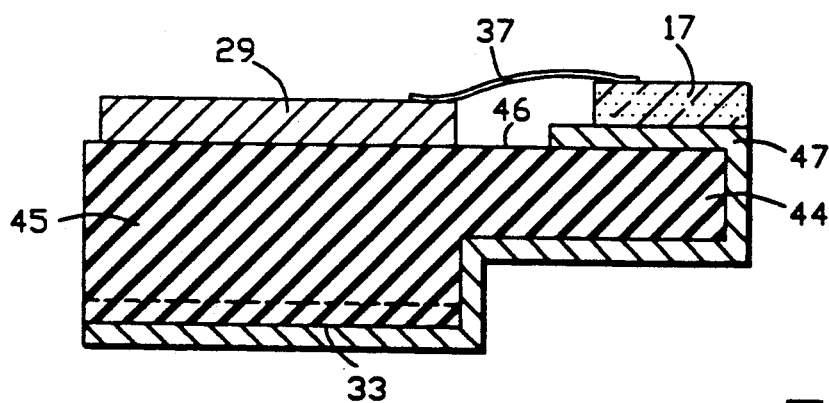
Figure 11:
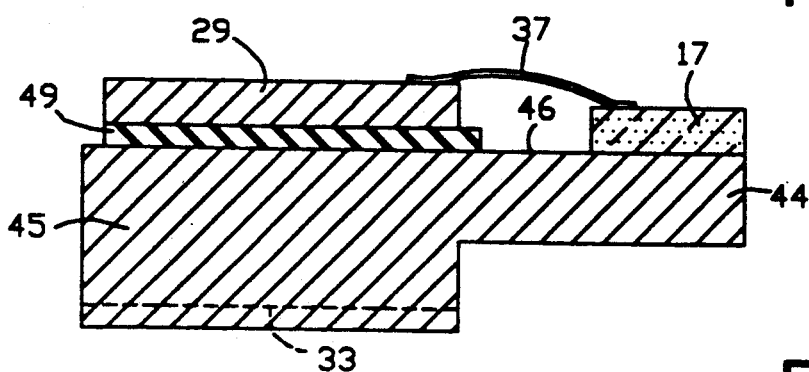

With reference to FIGS. 3 and 3A, the method of the present invention of assembling the submounts 13 of FIG. 2 into the two-dimensional laser array of FIG. 1 begins by providing submounts 13, 13', etc. with their constituent support plates 15, 15', etc., spacers 21, 21', etc. Then the semiconductor laser diode arrays or laser bars 17, 17', etc. are mounted to the front edges of their respective support plates 15, 15', etc. Wire bonds are made by welding leads 37, etc. to the tops of laser bars 17, etc. and to the channel areas 33, etc. of the spacers 21, etc. This provides the necessary electrically conductive paths through the laser diode arrays 17, etc. from the top surfaces 33, etc. to the bottom surfaces of the submounts 13, etc. The deformable metal layer 29, 29', etc. as heretofore described is then placed on the backside of the submounts 13, 13', etc.

Next, the submounts 13, 13', etc. are stacked one on top of another. The front edges of the support plates 15, 15', etc., where the laser bars 17, 17', etc. are located should face the same direction and line up, preferably so that the emitting faces of the laser bars 17, 17', etc. are substantially in a plane. The submounts 13, 13', etc. are pressed together to a specified separation d between the laser diode arrays 17, 17', etc. of adjacent submounts. Stacking and pressing typically occur one submount at a time, but could also be done all at once. Pressing the submounts 13 and 13' together causes the ridges 31' on one spacer 21' to penetrate the soft solder layer 29 of the adjacent submount 13. The deformable metal material 29 flows, since it is soft, and spreads into the channel area 33' of the adjacent submount 13', as seen by the displaced solder 39 in FIG. 3A. Preferably, the thickness of the deformable metal layer 29 is approximately the same or on the order of the height of the ridges 31' above the channels 33'. If the thicknesses are not equal, then the larger of the two dimensions determines the minimum spacing d to which the submounts 13 and 13' can be pressed, while the smaller of the two dimensions determines the range of available separations d. For maximum control over spacing, the ridge and layer heights should be selected so that, on average, the ridges 31' will penetrate about halfway through the deformable metal layer 29.

With reference to FIGS. 4–11, a number of submount constructions with respect to material are possible. Submounts must be electrically connectable to one another, and electrical connections need to be made within each submount to the laser bar 17. Preferably, the submounts' electrical connections are testable before they are stacked together and bonded into a completed assembly. This will allow defective submounts to be fixed or replaced, instead of discarding an entire assembly. In FIGS. 4, 5, 8 and 9, the support plate 15 and spacer 21 are of opposite conduction characteristic. That is, one is made from an electrically conductive material, such as metal, while the other is made from electrically insulating (though thermally conductive) material, such as a ceramic. These are necessary distinct, but connected, parts. By contrast, in FIGS. 6, 7, 10 and 11, the support and spacing functions are combines in a single unitary part 45 with the same electrical conduction characteristic, either conductive or insulating. The unitary part 45 is shaped essentially as a thick plate with a thinner front projection 49 upon which the laser bar 17 is mounted. When the support element 15 or 45 is electrically conductive, as in FIGS. 5, 7, 9 and 11, the laser bar 17 can be directly mounted to the one major surface of the support 15 or 45, through which current can be conducted to the other major surface on opposite side. When the support element 15 or 45 is electrically insulative, as in FIGS. 4, 6, 8 and 10, a metal coating 47 extends from a front portion of the top major surface, onto which the laser bar 17 is mounted, around the front edge to the underside or second major surface of the support 15 or 45. The solder layer 29 is necessarily on the opposite side of the support plate 15 from the spacer 21, or in the case of a unitary support and spacing part 45, on the same side 46 as the projection 44's flat surface. The laser bar 17 may be mounted either on the same side as the spacer 21 and the opposite side from the solder 29, as in FIGS. 4–7, in which case wire leads 37 connect to the channel areas 33 of the spacer 21 or unitary part 45. The laser bar 17 may also be mounted on the same side as the solder 29, as in FIGS. 8–11, in which case, the wire leads 37 connect to the solder 29 in areas corresponding to channels 33 on the adjacent submount. An insulating coating 49 is needed in the rear portion of the first major surface of the supports 15 and 45 in FIGS. 7, 9 and 11 to isolate the conductive support connected to one side of the laser 17 from the wires 37 connected to the other side of the laser 17. The coatings, whether metallic 47 or insulative 49, extend into the channels 33 in FIGS. 7 and 10, but do not completely fill them.

Figure 12:
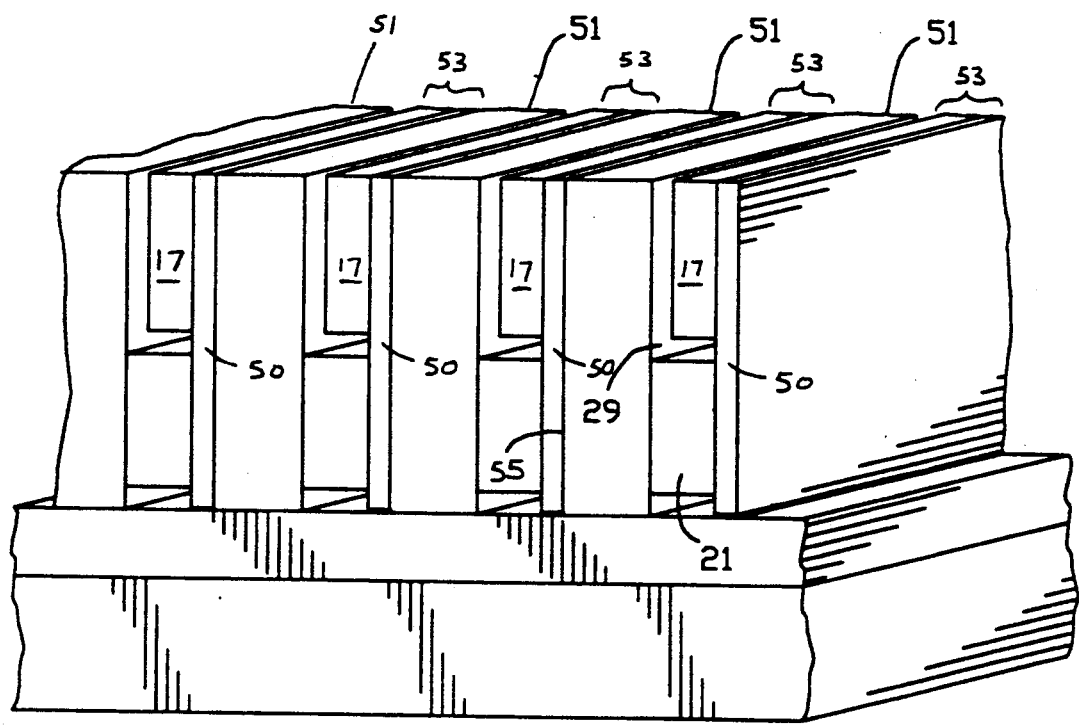
FIG. 12 is a perspective view of a two-dimensional laser diode array assembly made up of plural stacked laser array submounts of the present invention interleaved with physical and thermal spacer elements.

With reference to FIG. 12, the support plate 15 in the apparatus in FIG. 1 may be formed of two separate parallel subplates 50 and 51. A first subplate 50 is made of a material that is compatible with the mounting of the linear array 17 of diodes thereto, and is substantially the same as the support plate 15 described above. A second subplate 51 forms a spacer element that can be made of material of selectable thermal properties and thickness. Effectively, the submounts 53 in FIG. 12 are mounted such that they interleave with the spacers 51 in the two-dimensional laser array assembly. The spacers 51 may serve more than one independent purpose. They may serve as physical spacers, such that the spacing between individual submounts 53 can be set independently from the submount dimensions. Further, the spacers 51 may serve to conduct heat away from the array 17 and may be made of a high thermal conductance material, such as copper, chosen independent of the submount material constraints. This allows the laser arrays 17 to be operated at a higher average power. In using spacers 51, the various submount alternatives in FIGS. 4–11 are as previously described, except that the deformable metal layer 29 now appears on the spacer 51 on the side facing a ridged spacer 21. The opposing side of the spacer 51 has a thin second solder layer 55 on it to provide final electrical and mechanical bonding of the spacer 51 to the first subplate 50 of a submount. In this manner, all deformable metal or solder layers 29 may be deposited on the spacers 51, rather than on the submounts 53, thus simplifying the manufacture of these relatively fragile laser diode array submounts.

Figure 13:
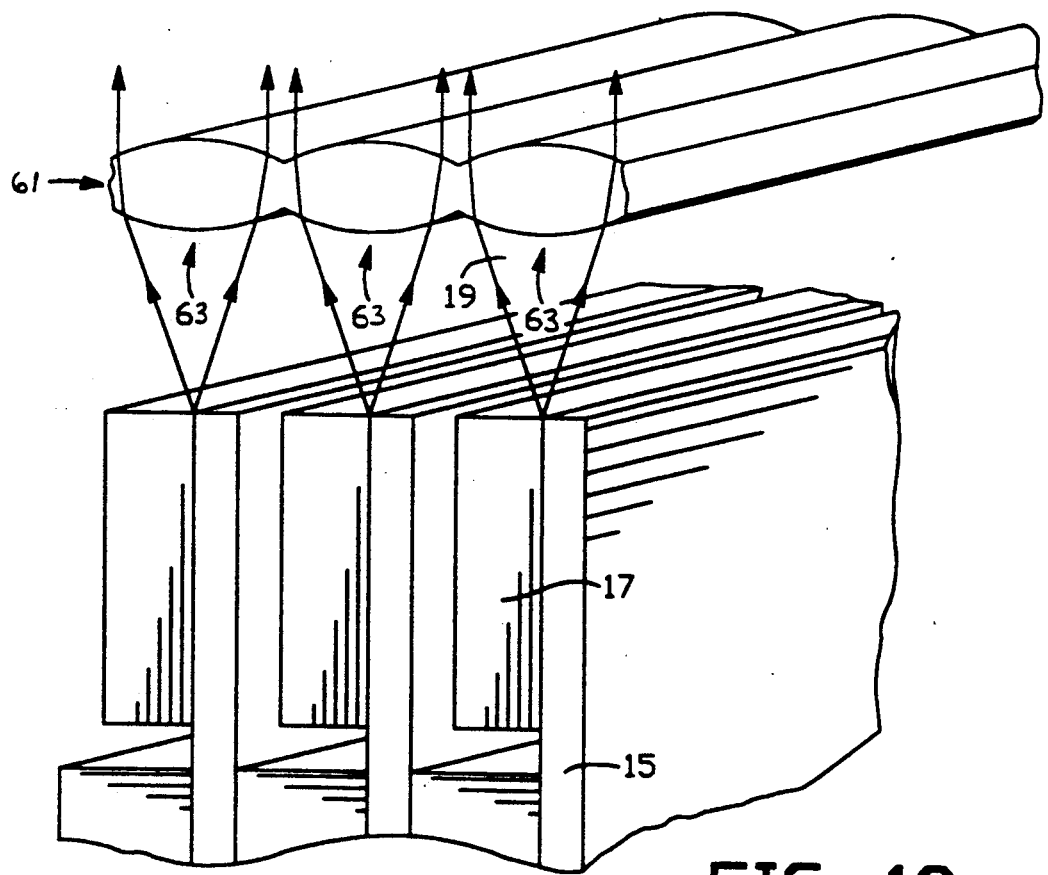
FIG. 13 is a perspective view of a two-dimensional laser diode array assembly made up of plural stacked laser array submounts of the present invention registered with an integral lenslet array.

With reference to FIG. 13, the submounts of the present invention may be mounted in a way that the resulting two-dimensional array assembly is registered with an integral lenslet array 61. The lenslets 63 of the array need not be cylindrical. The array assembly is made with a period that is equal to the lenslet period, such that the high long range registration tolerance of the assembly ensures that every laser diode array 17 is positioned in the same manner relatively to a lenslet 63 of the array 61, thereby ensuring that all refocused beams 19 are the same. In this manner and by capturing and collimating the full laser divergence in the laser beam 19 with lenslet 63 at the point at which adjacent beams 19 just begin to overlap, a high level of array brightness can be attained. The brightness level attainable is proportional to the ability to ensure registration between each laser 17 and lenslet 63.

We claim:

1. A two-dimensional laser array assembly employing a submount for stacking with a plurality of like laser array submounts, the submount comprising:

a support plate having first and second opposed major surfaces, a linear array of diode lasers mounted to a first of said major surfaces of said support plate, means on said support plate for providing spacing between said linear array on said support plate and a support plate of an adjacent submount when said plural submounts are combined in said two-dimensional laser array assembly, said spacing means having a nonplanar outer surface profile including plural spaced apart hard projections protruding outwardly from a major surface of said support plate with nonprojecting surface regions defined therebetween, a layer of deformable metal material disposed on the opposite major surface of said support plate from said spacing means, said deformable metal layer capable of being penetrated by projections from an adjacent submount when said submounts are pressed together to a specified separation between linear arrays of said submounts, said deformable metal material spreading to fill a portion of said nonprojecting surface regions of said adjacent submount, and means for providing an electrically conductive path through said linear array to said second major surface and for providing electrical connection between submounts.

2. The apparatus of claim 1 wherein said hard projections are a set of ridges with channels therebetween constituting said nonprojecting surface regions.

3. The apparatus of claim 1 wherein said deformable metal layer has a thickness on the order of a height of said projections out of said nonprojecting surface regions.

4. The apparatus of claim 1 wherein said spacing means comprises a spacer plate disposed on said support plate, said ridges protruding from a surface of said spacer plate, the combined thickness of said spacer plate and projections being greater than a height of said linear array.

5. The apparatus of claim 1 wherein said spacing means comprises a thicker rear portion of said support plate, said support plate being a unitary body shaped with said projections on said thicker rear portion and with a thin front edge projection upon which said linear array is mounted.

6. The apparatus of claim 1 wherein said spacing means is provided on the first major surface rearward of and on the same side of said support plate as said linear array, said deformable metal layer being disposed on said second major surface.

7. The apparatus of claim 1 wherein said spacing means is provided on the second major surface major surface rearward of but on the opposite side of said support plate from said linear array, said deformable metal layer being disposed on said first major surface.

8. The apparatus of claim 1 wherein said projections comprise ridges that extend in a longitudinal direction substantially perpendicular to a light emitting facet of said linear array.

9. The apparatus of claim 1 wherein said projections comprise ridges that extend in a lateral direction substantially parallel to a light emitting facet of said linear array.

10. The apparatus of claim 1 wherein said projections comprise ridges that extend in a longitudinal and lateral waffle pattern both perpendicular and parallel to a light emitting facet of said linear array.

11. The apparatus of claim 1 wherein said support plate is electrically conducting, an electrical insulator being disposed on a rear portion of said first major surface.

12. The apparatus of claim 1 wherein said support plate is electrically insulating, an electrically conductive layer being disposed under said linear array and extending around the front edge of said support plate to said second major surface.

13. The apparatus of claim 1 wherein said electrically conductive path includes wire bonds extending from a top surface of said linear array to nonprojecting surface regions between said projections.

14. The apparatus of claim 1 wherein said electrically conductive path includes wire bonds extending from a top surface of said linear array to said layer of deformable metal layer.

15. The apparatus of claim 1 wherein said deformable metal layer is composed of a soft solder selected from the group consisting of indium, tin, bismuth, thallium, cadmium and lead, and alloys of two or more of gallium, indium, tin, bismuth, thallium, cadmium, lead, zinc and antimony having a melting temperature in a range from 100° C. to 400° C.

16. The apparatus of claim 1 further comprising heat conducting path means for removing excess heat from said linear array.

17. The apparatus of claim 16 wherein said heat conducting path means includes and is integral with said support plate.

18. The apparatus of claim 1 wherein said support plate comprises two separate parallel subplates, a first of said subplates being composed of a material that is comparable with the mounting of said linear array of diode lasers to said first subplate, a second of said subplates being composed of a material of selectable thermal properties and selectable thickness for providing specified thermal properties and specified submount spacing to the two-dimensional laser array assembly.

19. The apparatus of claim 1 further comprising a lensed array characterized by a spacing between lenslets of said array, said laser array submounts being stacked together to a specified separation between linear arrays of diode lasers that exactly registers with said spacing between said lenslets, said lenslets being disposed in front of said linear arrays of diode lasers.

20. A laser diode submount comprising, a linear laser diode array having first and second electrical contacts, said first electrical contact mounted on a first surface, said first surface providing a first electrically conducting surface region, a second surface which is electrically isolated from said first surface, said second surface having multiple indented sections, said indented sections providing a plurality of second electrically conducting surface regions, means for electrically connecting said second electrical contact of said linear laser diode array to said second electrically conducting surface regions, and means associated with one of said first and second surfaces for affixing the submount to a corresponding opposite surface of another submount with a precise spacing between linear laser diode arrays of the submounts.

21. The submount of claim 20 wherein said means for affixing comprises a deformable metal material.

22. The submount of claim 21 wherein said means for affixing further comprises a spacer element of selectable thickness.

23. A method of assembling a two-dimensional laser array with precise separation between the adjacent linear arrays of laser diodes that form the two-dimensional array, the method comprising:

providing a plurality of linear laser array submounts, each submount including a support plate having first and second opposed major surfaces, means on the support plate for providing spacing between adjacent support plates when the submounts are assembled together, said spacing means having plural spaced apart ridges protruding perpendicular to a major surface of said support plate with channels defined therebetween, and a layer of deformable metal material disposed on the opposite major surface from said spacing means, mounting a semiconductor laser diode array to a front edge of said support plate of each submount, providing an electrically conductive path through said laser diode array to said second major surface, stacking said submounts one on top of another with the front edges of the support plates facing the same direction, and pressing said submounts together to a specified separation between laser diode arrays of adjacent submounts, said ridges penetrating said deformable metal layer of an adjacent submount, said deformable metal material spreading to fill a portion of said channels between said ridges of an adjacent submount.

* * * * *

UNITED STATES PATENT AND TRADEMARK OFFICE
CERTIFICATE OF CORRECTION

PATENT NO. : 5,099,488

DATED : March 24, 1992

INVENTOR(S) : Mitra Ahrabi et al.

It is certified that error appears in the above-identified patent and that said Letters Patent is hereby corrected as shown below:

[57] Abstract, line 13, "into stackes of" should read
- -into stacks of - -.

Column 1, line 39, "W/cm$^2$ Many of such" should read
- -W/cm$^2$. Many of such- -.

Column 5, line 68, "functions are combines" should read
- -functions are combined- -.

Claim 7, column 8, lines 4-5, "on the second major surface major surface rearward of" should read - -on the second major surface rearward of- -.

Signed and Sealed this

Tenth Day of August, 1993

Attest:

MICHAEL K. KIRK

*Attesting Officer*  *Acting Commissioner of Patents and Trademarks*